(12) United States Patent
Weaver, Jr. et al.

(10) Patent No.: US 7,635,203 B2
(45) Date of Patent: Dec. 22, 2009

(54) METHOD AND APPARATUS FOR LED PANEL LAMP SYSTEMS

(75) Inventors: Stanton E. Weaver, Jr., Northville, NY (US); Thomas E. Stecher, Scotia, NY (US); Anant A. Setlur, Niskayuna, NY (US); Alok M. Srivastava, Niskayuna, NY (US); Holly A. Comanzo, Niskayuna, NY (US); Charles A. Becker, Schenectady, NY (US); Thomas F. Soules, Livermore, CA (US); Chen-Lun Hsing Chen, Longtan Township, Taoyuan County (TW); Rebecca A. Bompiedi, Cincinnati, OH (US)

(73) Assignee: Lumination LLC, Valley View, OH (US)

( * ) Notice: Subject to any disclaimer, the term of this patent is extended or adjusted under 35 U.S.C. 154(b) by 0 days.

(21) Appl. No.: 10/555,913

(22) PCT Filed: May 5, 2004

(86) PCT No.: PCT/US2004/014226

§ 371 (c)(1),
(2), (4) Date: Mar. 19, 2007

(87) PCT Pub. No.: WO2004/100226

PCT Pub. Date: Nov. 18, 2004

(65) Prior Publication Data

US 2007/0258229 A1 Nov. 8, 2007

(51) Int. Cl.
*F21V 23/02* (2006.01)

(52) U.S. Cl. ............ 362/260; 362/230; 362/241; 362/294; 362/545; 362/800; 257/98; 257/99; 313/502; 313/512

(58) Field of Classification Search ............ 257/98, 257/99; 313/502, 512; 362/84, 240, 241, 362/230, 260, 293, 294, 307, 545, 800
See application file for complete search history.

(56) References Cited

U.S. PATENT DOCUMENTS 5,634,711 A    6/1997   Kennedy et al.

(Continued)

FOREIGN PATENT DOCUMENTS

EP       1 024 539 A2    2/2000

(Continued)

OTHER PUBLICATIONS

P. Schlotter, R. Schmidt, J. Schneider, Rapid Communication "Luminescence Conversion of Blue Light Emitting Diodes", Applied Physics A 64, 417-418, Materials Science & Processing, Springer-Verlag 1997, 2 pages.

(Continued)

*Primary Examiner*—Stephen F Husar
(74) *Attorney, Agent, or Firm*—Fay Sharpe LLP

(57) ABSTRACT

A lighting apparatus (10) comprises a light engine (12) producing ultra violet radiation. An enclosure (14) surrounds a radiation generating area of the light engine (12) to encompass the radiation. At least one wall (28) of the enclosure (14) is substantially reflective of the ultraviolet radiation. The enclosure (14) includes a replaceable top portion (30) which includes a phosphor portion (32). The phosphor portion (32) is spaced from the radiation generating area of the light engine (12) by a height of the enclosure (14).

18 Claims, 4 Drawing Sheets

U.S. PATENT DOCUMENTS

| | | |
|---|---|---|
| 6,048,616 A | 4/2000 | Gallagher et al. |
| 6,068,383 A | 5/2000 | Robertson et al. |
| 6,155,699 A | 12/2000 | Miller et al. |
| 6,207,229 B1 | 3/2001 | Bawendi et al. |
| 6,357,889 B1 | 3/2002 | Duggal et al. |
| 6,366,033 B1 | 4/2002 | Greci et al. |
| 6,450,664 B1 | 9/2002 | Kelly |
| 6,719,446 B2 * | 4/2004 | Cao .................... 362/294 |
| 7,319,246 B2 * | 1/2008 | Soules et al. ............ 257/98 |
| 2002/0084748 A1 | 7/2002 | Ayala et al. |
| 2002/0158565 A1 | 10/2002 | Setlur et al. |
| 2003/0048641 A1 | 3/2003 | Alexanderson et al. |

FOREIGN PATENT DOCUMENTS

| | | |
|---|---|---|
| EP | 1 282 171 A2 | 2/2003 |
| WO | WO 02/11173 A1 | 2/2002 |
| WO | WO 02/089175 A1 | 11/2002 |

OTHER PUBLICATIONS

EPO European Search Report, Application No. 04751568.9—2423 PCT/US2004014226, completed Dec. 7, 2006.

* cited by examiner

METHOD AND APPARATUS FOR LED PANEL LAMP SYSTEMS

BACKGROUND

The present application relates to the art of the LED lighting systems that produce visible light. It finds application in general purpose lighting and will be described with particular reference thereto. Those skilled in the art will appreciate applicability of the present application to a variety of applications such as ornamental, special effects lighting, and other.

Typically, the LED lighting systems, which produce white or visible light, incorporate blue LEDs coated with phosphor that converts some of the blue light radiation to a complimentary color, e.g. yellow-green emission. Combined blue, yellow and green emissions produce a white light, which typically has a correlated temperature of about 5000 K and a color rendition index (Ra) of about 70-75.

In recent years, newly developed white LED lighting systems unitize a UV emitting chip coated with phosphors which are designed to convert the UV radiation to visible light. Often, two or more phosphor emission bands are employed to approximate white light.

There are several problems associated with phosphor coated LEDs. Historically, phosphor coated LEDs have had rather low package efficiencies. The package efficiency is defined as the ratio of the actual light output of the LED to the light that would be obtained if all the radiation generated escaped from the package without being absorbed. Because phosphor particles generate light that is radiated equally in all directions, some of the light is directed backwards, e.g. toward the LED chip, substrate, submount, and lead structure which absorb a substantial amount of light. In addition, because the phosphors typically are not perfect absorbers of UV or blue radiation, some of the radiation emitted by the LED chip itself is also reflected back onto the structural elements mentioned above.

Additionally, in order to avoid the UV bleed through, the phosphor coating typically must be relatively thick, e.g. at least 5-7 particles thick, which increases the coating's visible reflectance. The light lost due to an absorption of radiation (both initial and converted) by the LED chip, submount, reflector and lead structure limits the package efficiency of phosphor coated LEDs to typically 50-70%.

Furthermore, certain phosphors, such as some from the manganese family, have excessive decay times. When the phosphors with excessive decay times are exposed to high flux emission, i.e., in the close proximity to the LEDs, the effective efficiency is reduced.

The present application contemplates a new and improved apparatus that overcomes the above-reverenced problems and others.

BRIEF DESCRIPTION

In accordance with one aspect of the present application, a lighting apparatus is disclosed. The lighting apparatus comprises a light engine for producing an ultra violet radiation and an enclosure which surrounds a radiation generating area of the light engine to at least substantially encompass the radiation. The enclosure includes a first portion which is substantially reflective of the ultra violet radiation, and at least one second portion which includes a phosphor portion. The second portion is spaced from the radiation generating area of the light engine and includes a radiation receiving surface and a light emitting surface to render visible light.

In accordance with another aspect of the present application, a lighting system is disclosed. The light system includes a light engine having a direction of primary radiation emission. The light engine includes a PC board, a plurality of UV LEDs disposed on the PC board, and a heat sink disposed on a side of the PC board opposed to the LEDs. The lighting system further includes an enclosure surrounding the direction of radiation emission. The enclosure includes at least one portion which substantially reflects UV radiation, and a phosphor containing portion generally opposite and spaced from the light engine. The phosphor containing portion includes a visible light reflecting layer on a first side of the phosphor facing the light engine and a UV light reflecting layer on a second side of the phosphor away from the light engine.

One advantage of the present application resides in remotely placing the phosphor away from the LED sources.

Another advantage resides in providing a structure in which phosphor mix and concentration are adjusted remotely.

Another advantage resides in interchangeability of the phosphor containing panel.

BRIEF DESCRIPTION OF THE DRAWINGS

The application may take form in various components and arrangements of components, and in various steps and arrangements of steps. The drawings are only for purposes of illustrating the preferred embodiments and are not to be construed as limiting the application.

DETAILED DESCRIPTION

Figure 1:
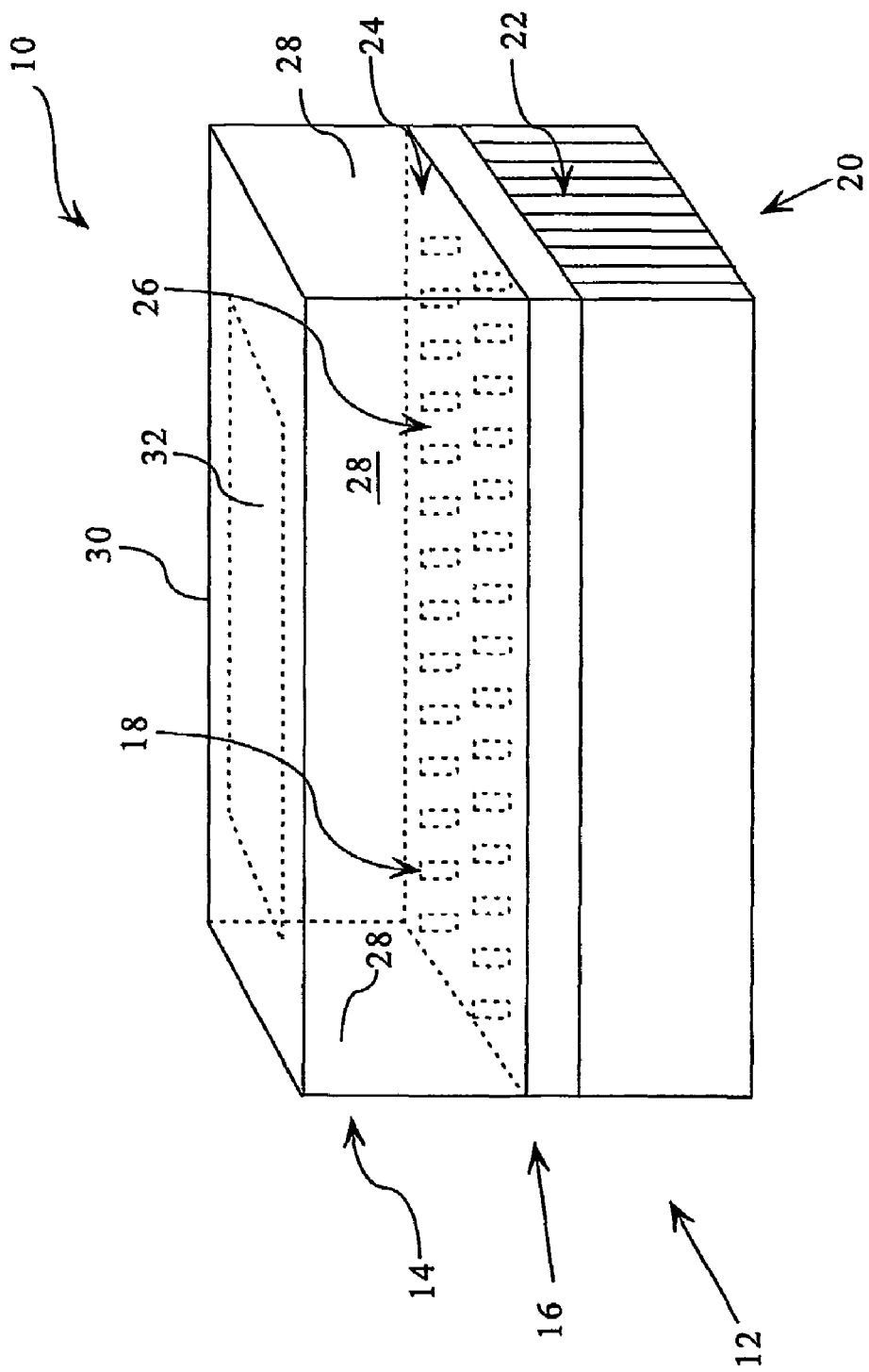
FIG. 1 is a schematic view of an LED lighting assembly in accordance with the present application.
Figure 3:
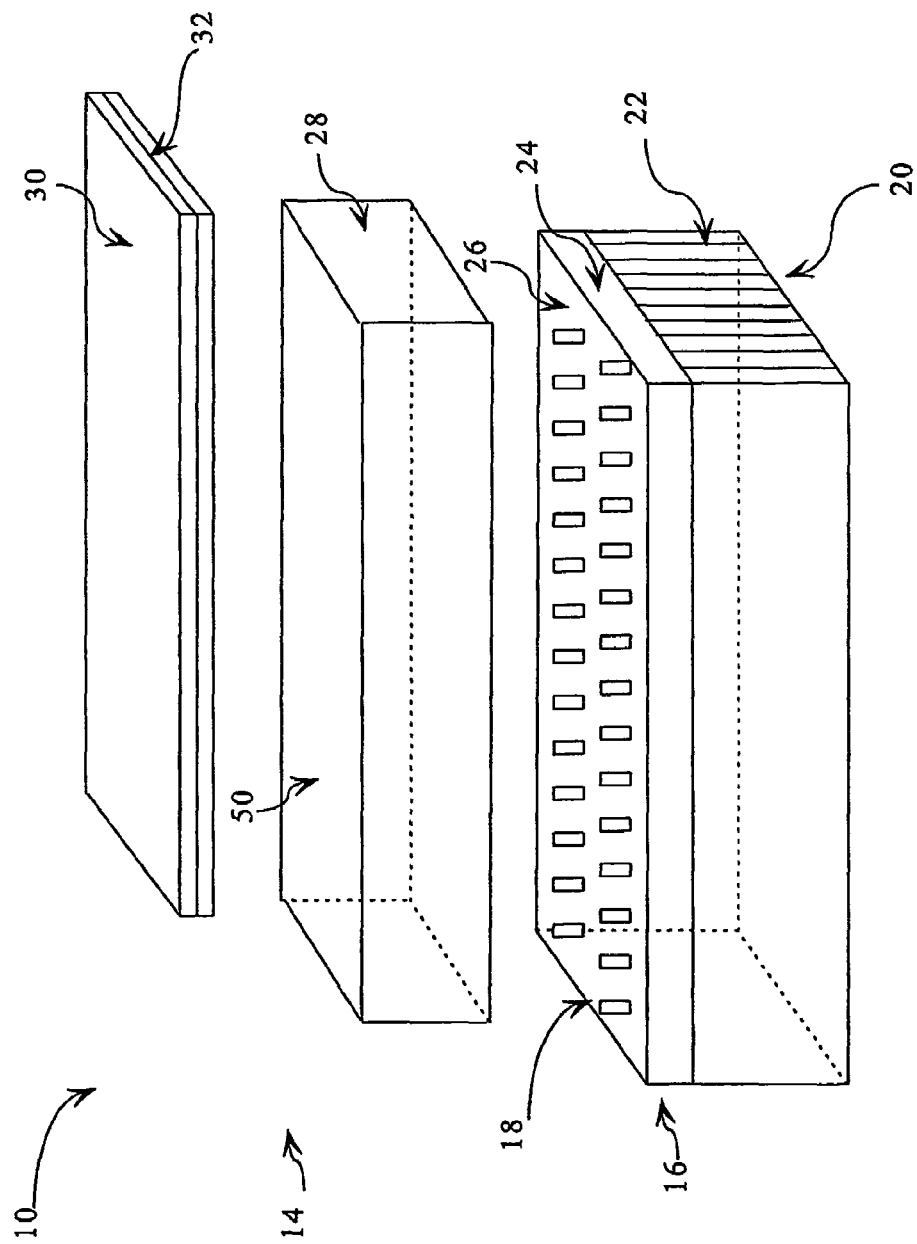
FIG. 3 is a schematic view of the LED lighting assembly with a removable top panel.
Figure 4:
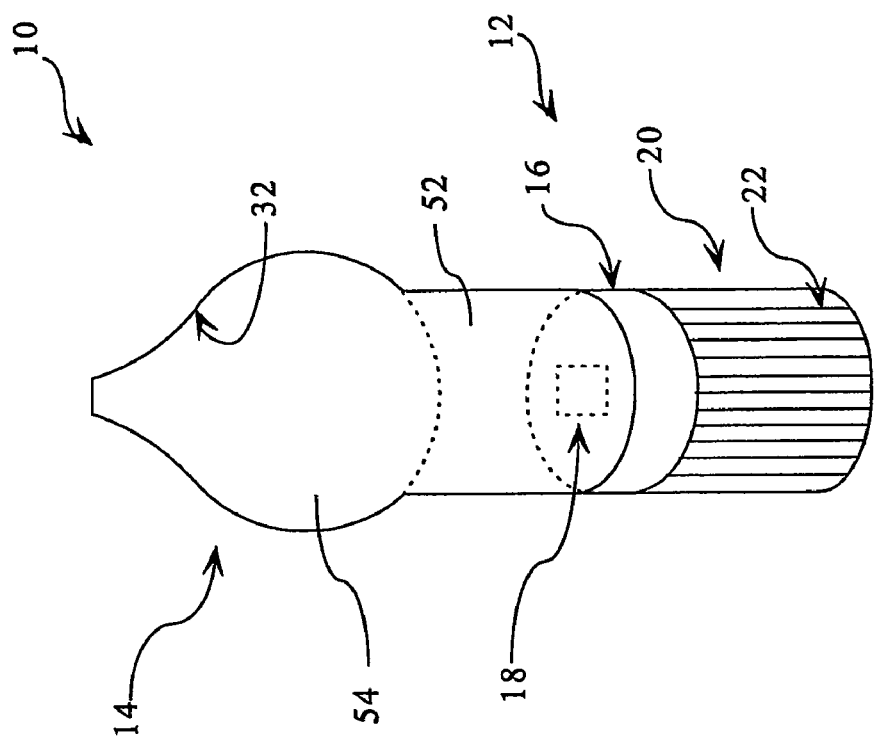
FIG. 4 is a cross-sectional view of the LED lighting assembly having a bulb shape enclosure.

With reference to FIGS. 1 and 3-4, an LED panel light assembly 10 generally comprises a light engine 12 and an enclosure 14 which surrounds the radiation emitted by the light engine 12. The light engine 12 includes an interconnect system 16 for mounting and connecting light emitting devices or LEDs 18 such as chip or packaged UV LEDs. Preferably, the LEDs 18 have wavelengths less than 510 nm. A heatsink 20, including a plurality of heat dissipating elements such as wings 12, is disposed in thermal connection with the LEDs 18 and the interconnect system 16 to dissipate heat generated by the LEDs 18. Preferably, the interconnect system 16 includes a printed circuit board or an interconnect board or interconnect boards 24 which includes circuitry for powering the LEDs 18 and the leads for electrical communication with a power source. The interconnect boards 24 are selected from commercially available circuit boards, such as the circuit boards available from BERGQUIST, to provide suitable means for removing heat generated by the LEDs 18 and dissipating it in the heatsink 20. Preferably, the interconnect board 24 is a thermally conductive type, an epoxy glass resin board with thermal vias, or the like. A mounting surface 26 of the interconnect system 16 is preferably manufactured from a highly reflective material. In one embodiment, the surface 26 is coated with a reflective material leaving the openings for the emitters. Preferably, the light assembly 10 utilizes internal or external electronics to achieve the desired voltage and current drive levels. In one embodiment, series and/or parallel circuits are created to provide the desired operating voltage and improve reliability of the overall system.

The LEDs 18 are attached to the interconnect board(s) 24 in arrays or strips depending on the requirements of the lighting system. In one embodiment, in which the packaged LEDs are used, the LEDs 18 are soldered, adhered by a use of a conductive adhesive, or otherwise conductively fastened to the interconnect board 24. In another embodiment, in which the chip LEDs or LEDs on submounts are used, the LEDs 18 are directly attached to the interconnect board 24 by a use of a thermally conductive adhesive and are electrically wirebonded to the circuitry. Alternatively, chip LEDs are flip mounted and directly attached to the board 24 using conductive adhesive, solder, thermosonic, or thermo-compression methods. An index matching gel is preferably applied over the chip surface of the chip LEDs. The interconnect system 16 is attached to the heatsink 20 using a thermally conductive compound.

With continuing reference to FIG. 1, the enclosure 14 includes four walls or sides 28 and a top panel 30. At least a portion of the enclosure 14 includes a phosphor layer 32 to convert the UV radiation, emitted by the LEDs 18, to visible light. In one embodiment, the phosphor layer 32 is a tri-color (red-green-blue) phosphor which is dispersed within or exists in an internal uniform layer of the panel 30. Preferably, the control optics are integrated into the panel structure. An air gap between the top panel 30 and the LEDs 18 is controlled by a height of the enclosure 14, e.g. height of the walls 28. The enclosure height is determined such that the light system 10 provides an uniform emission pattern. Typically, the enclosure height is selected depending on spacing and the angular emission pattern of the LEDs 18.

Preferably, at least a portion of the enclosure walls 28 includes a UV reflective coating such that a substantial amount of the UV radiation striking the walls 28 is reflected back into the enclosure 14. Optionally, the walls 28 are constructed from the UV reflective material. In one embodiment, an interior of the walls 28 is coated with a material that is highly reflective to the wavelengths of light generated by the phosphor that exists within the system.

Typically, the phosphors for the lighting system 10 are selected for high efficiency and proper color during the light system 10 operation, and to minimize the intensity of saturation effects. Preferably, the phosphors are selected from phosphors with color temperatures (CCTs) ranging from 2500 to 10000 K and color rendering indicies (CRIs) ranging from 50 to 99. The phosphor blend or concentration are readily changed to create a wide variety of color temperatures, color points or CRIs for an individual user without changes to the light engine 12. Examples of inorganic phosphors that are used in the present application are given in Table 1. In one embodiment, the organic phosphors or combinations of inorganic and organic phosphors are used. Examples of the organic phosphors for a use with the present application are the BASF Lumogen F dyes such as Lumogen F Yellow 083, Lumogen F Orange 240, Lumogen F Red 300, and Lumogen F Violet 570. Of course, it is also contemplated that other phosphors such as the earth complexes with organic component described in the U.S. Pat. No. 6,366,033; quantum dot phosphors described in the U.S. Pat. No. 6,207,229; nanophosphors described in the U.S. Pat. No. 6,048,616; or other suitable phosphors are used.

Preferably, the saturation effects are minimized by choosing phosphors with the fast decay times ($\tau<1$ ms). Optionally, the saturation effects are minimized by diffusing the incidental UV flux on phosphors which have slower decay times. In one embodiment, the diffusing the incidental UV flux on phosphors is achieved by moving the phosphor layers further away from the UV emitting LEDs.

TABLE 1

| Phosphor Color | Power Material |
|---|---|
| Blue | $(Ba, Sr, Ca)_5(PO_4)_3(Cl, F, Br, OH):Eu^{2+}, Mn^{2+}, Sb^{3+}$ |
| | $(Ba, Sr, Ca)MgAl_{10}O_{17}:Eu^{2+}, Mn^{2+}$ |
| | $(Ba, Sr, Ca)BPO_5:Eu^{2+}, Mn^{2+}$ |
| | $(Sr, Ca)_{10}(PO_4)_6 \ast nB_2O_3:Eu^{2+}$ |
| | $2SrO \ast 0.84P_2O_5 \ast 0.16B_2O_3:Eu^{2+}$ |
| | $Sr_2Si_3O_8 \ast 2SrCl_2:Eu^{2+}$ |
| | $Ba_3MgSi_2O_8:Eu^{2+}$ |
| | $Sr_4Al_{14}O_{25}:Eu^{2+}$ (SAE) |
| | $BaAl_8O_{13}:Eu^{2+}$ |
| Blue-Green | $Sr_4Al_{14}O_{25}:Eu^{2+}$ |
| | $BaAl_8O_{13}:Eu^{2+}$ |
| | $2SrO-0.84P_2O_{5-0.16}B_2O_3:Eu^{2+}$ |
| | $(Ba, Sr, Ca)MgAl_{10}O_{17}:Eu^{2+}, Mn^{2+}$ |
| | $(Ba, Sr, Ca)_5(PO_4)_3(Cl, F, OH):Eu^{2+}, Mn^{2+}, Sb^{3+}$ |
| Green | $(Ba, Sr, Ca)MgAl_{10}O_{17}:Eu^{2+}, Mn^{2+}$ (BAMn) |
| | $(Ba, Sr, Ca)Al_2O_4:Eu^{2+}$ |
| | $(Y, Gd, Lu, Sc, La)BO_3:Ce^{3+}, Tb^{3+}$ |
| | $Ca_8Mg(SiO_4)_4Cl_2:Eu^{2+}, Mn^{2+}$ |
| | $(Ba, Sr, Ca)_2SiO_4:Eu^{2+}$ |
| | $(Ba, Sr, Ca)_2(Mg, Zn)Si_2O_7:Eu^{2+}$ |
| | $(Sr, Ca, Ba)(Al, Ga, In)_2S_4:Eu^{2+}$ |
| | $(Y, Gd, Tb, La, Sm, Pr, Lu)_3(Al, Ga)_5O_{12}:Ce^{3+}$ |
| | $(Ca, Sr)_8(Mg, Zn)(SiO_4)_4Cl_2:Eu^{2+}, Mn^{2+}$ (CASI) |
| | $Na_2Gd_2B_2O_7:Ce^{3+}, Tb^{3+}$ |
| | $(Ba, Sr)_2(Ca, Mg, Zn)B_2O_6:K, Ce, Tb$ |
| Orange-yellow | $(Sr, Ca, Ba, Mg, Zn)_2P_2O_7:Eu^{2+}, Mn^{2+}$ (SPP); |
| | $(Ca, Sr, Ba, Mg)_{10}(PO_4)_6(F, Cl, Br, OH):Eu^{2+}, Mn^{2+}$ (HALO); |
| | $((Y, Lu, Gd, Tb)_{1-x}Sc_xCe_y)_2(Ca, Mg)_{1-r}(Mg, Zn)_{2+r}Si_{z-q}Ge_qO_{12+\delta}$, |
| Red | $(Gd, Y, Lu, La)_2O_3:Eu^{3+}, Bi^{3+}$ |
| | $(Gd, Y, Lu, La)_2O_2S:Eu^{3+}, Bi^{3+}$ |
| | $(Gd, Y, Lu, La)VO_4:Eu^{3+}, Bi^{3+}$ |
| | $(Ca, Sr)S:Eu^{2+}, Ce^{3+}$ |
| | $SrY_2S_4:Eu^{2+}, Ce^{3+}$ |
| | $CaLa_2S_4:Ce^{3+}$ |
| | $(Ca, Sr)S:Eu^{2+}$ |
| | $3.5MgO \ast 0.5MgF_2 \ast GeO_2:Mn^{4+}$ (MFG) |
| | $(Ba, Sr, Ca)MgP_2O_7:Eu_{2+}, Mn_{2+}$ |
| | $(Y, Lu)_2WO_6:Eu^{3+}, Mo^{6+}$ |
| | $(Ba, Sr, Ca)_xSi_yN_z:Eu^{2+}, Ce^{3+}$ |

Figure 2:
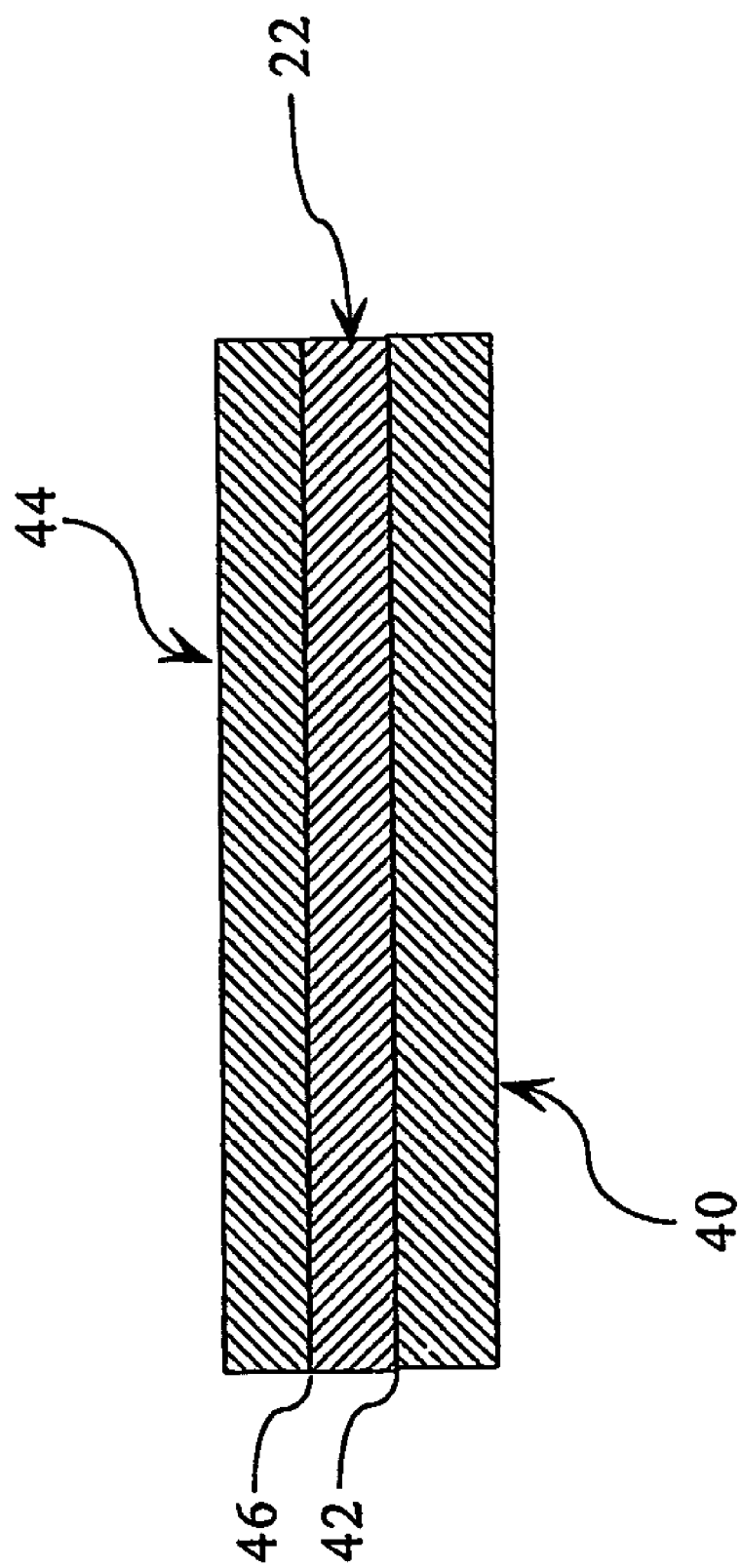
FIG. 2 is a cross-sectional view of a phosphor containing element.

With reference to FIG. 2, a coating 40 is disposed on a radiation receiving or an interior surface 42 of the phosphor layer 32. The coating 40 is transmissive to the wavelengths of the LEDs 18 yet reflective to the wavelengths produced by the phosphors of the phosphor layer 32. Optionally, a second coating 44 is disposed on a light emitting or an exterior surface 46 of the phosphor layer 32 to reflect any non-converted LED bleed through back into the phosphor layer 32.

With reference again to FIG. 3, in one embodiment, the enclosure 14 includes the top panel 30 which is a replaceable or removable panel that fits into an opening 50 in a top part of the enclosure 14. Such construction of the enclosure 14, e. g. including the removable phosphorescent top panel, allows for an interchangeability of the panel 30 to meet custom color temperatures and color rendition indexes for an individual user while utilizing the same light engine 12 and enclosure walls 28.

With reference again to FIG. 4, in one embodiment, the lighting system 10 is constructed to resemble the standard incandescent bulb type. Of course, it is also contemplated that the lighting system 10 may be constructed to resemble other geometric shapes, such as spheres, ellipses, or is custom built to fit the needs of an individual user. The enclosure 14 includes a first portion 52 which is disposed on the interconnect board 16 and extends longitudinally in the direction opposite the heatsink 20. A second portion 54 of the enclosure 14 fits into the opening 50 (not shown) on the top of the first portion 52 to enclose the radiation emitted by the lighting engine 12. Preferably, the first portion 52 of the enclosure 14 includes a UV reflective coating of inherent material property while the second portion 54 includes a radiation converting phosphor 32.

The application has been described with reference to the preferred embodiments. Modifications and alterations will occur to others upon a reading and understanding of the preceding detailed description. It is intended that the application be construed as including all such modifications and alterations insofar as they come within the scope of the appended claims or the equivalents thereof.

The invention claimed is:

1. A lighting apparatus comprising:
a light engine for producing an ultra violet radiation comprised of
LEDs disposed on a circuit board to emit the ultra violet radiation
wherein a mounting surface of the printed circuit board is reflective of the UV radiation; and
an enclosure surrounding a radiation generating area of the light engine to at least substantially encompass the radiation, the enclosure includes:
a first portion which is substantially reflective of the ultra violet radiation, and
at least one second portion which includes a phosphor portion, the second portion being spaced from the radiation generating area of the light engine, the phosphor portion includes:
a radiation receiving surface and a light emitting surface to render visible light.

2. The apparatus as set forth in claim 1, wherein the light engine includes:
a heatsink disposed on a side of the circuit board opposed to the LEDs to dissipate heat generated by the LEDs.

3. The apparatus as set forth in claim 2, wherein the LEDs have a wavelength equal to or less than 510 nm.

4. The apparatus as set forth in claim 2, wherein the heatsink includes a plurality of wings.

5. The apparatus as set forth in claim 1, wherein the enclosure has a shape of an incandescent bulb.

6. The apparatus as set forth in claim 1, wherein the phosphor portion is created by dispersing a phosphor powder within the at least one second portion of the enclosure.

7. The apparatus as set forth in claim 1, wherein the phosphor portion is a generally planar body including:
a substantially uniform internal layer of a phosphor material.

8. The apparatus as set forth in claim 1, wherein the phosphor portion includes:
a first reflective coating disposed about a radiation receiving surface, which is transmissive to wavelengths of the ultraviolet radiation and reflective to wavelengths of light emitted by phosphor existing in the phosphor portion.

9. The apparatus as set forth in claim 1, wherein the phosphor portion includes:
a second reflective coating disposed about a light emitting surface, which second coating is reflective to the ultraviolet radiation and transmissive to wavelengths of light emitted by phosphor existing in the phosphor portion.

10. The apparatus as set forth in claim 1, wherein the enclosure includes:
sides; and
a removable top panel, which includes the phosphor portion.

11. The apparatus as set forth in claim 10, wherein the phosphor portion includes:
a tri-color red-green-blue phosphor with color temperatures from 2500 to 10000 K and color rendering indicies from 50 to 99 for producing an uniform visible light.

12. The apparatus as set forth in claim 10, wherein an interior surface of the sides is a reflective material which is substantially reflective to ultra violet radiation and wavelengths of light emitted by the phosphor.

13. The apparatus as set forth in claim 12, wherein an interior surface of the sides is coated with a reflective material, which is substantially reflective to ultra violet radiation and wavelengths of light emitted by the phosphor.

14. The apparatus as set forth in claim 10, further including:
a plurality of replaceable removable top panels, wherein phosphor mix and concentration is predetermined for each phosphor portion of each top panel such that the lighting system produces multiple preselected visible light colors by interchanging the top panels.

15. A lighting system comprising:
a light engine having a direction of primary radiation emission and including:
a PC board,
a plurality of UV LEDs disposed on the PC board, and
a heat sink disposed on a side of the PC board opposed to the LEDs; and
an enclosure surrounding the direction of radiation emission and including:
at least one portion which substantially reflects UV radiation, and
a phosphor containing portion generally opposite and spaced from the light engine, the phosphor containing portion including:
a visible light reflecting layer on a first side of the phosphor facing the light engine and a UV light reflecting layer on a second side of the phosphor away from the light engine.

16. A lighting apparatus comprising:
a light engine for producing an ultra violet radiation; and
an enclosure surrounding a radiation generating area of the light engine to at least substantially encompass the radiation, the enclosure including:
a first portion which is substantially reflective of the ultra violet radiation, and
at least one second portion which includes a phosphor portion, the second portion being spaced from the radiation generating area of the light engine, the phosphor portion comprising:
a radiation receiving surface and a light emitting surface to render visible light; and
a first reflective coating disposed about the radiation receiving surface, which is transmissive to wavelengths of the ultraviolet radiation and reflective to wavelengths of light emitted by phosphor existing in the phosphor portion.

17. A lighting apparatus comprising:
a light engine for producing an ultra violet radiation; and
an enclosure surrounding a radiation generating area of the light engine to at least substantially encompass the radiation, the enclosure including:
a first portion which is substantially reflective of the ultra violet radiation, and
at least one top portion which includes a phosphor portion, the top portion being spaced from the radiation generating area of the light engine, the phosphor portion comprising a radiation receiving surface and a light emitting surface to render uniform visible light, and a tri-color red-green-blue phosphor with color temperatures from 2500 to 10000 K and color rendering indicies from 50 to 99 for producing the uniform visible light.

18. A lighting apparatus comprising:
   a light engine for producing an ultra violet radiation;
   an enclosure surrounding a radiation generating area of the light engine to at least substantially encompass the radiation, the enclosure including:
      a side portion which is substantially reflective of the ultra violet radiation, and
      a plurality of replaceable removable top panels which include a phosphor portion, the top panel being spaced from the radiation generating area of the light engine, the phosphor portion including:
   a radiation receiving surface and a light emitting surface to render visible light and a phosphor having a mix and concentration predetermined for each phosphor portion of each top panel such that the lighting system produces multiple preselected visible light colors by interchanging the top panels.

* * * * *